United States Patent [19]

Bernier

[11] 4,107,604

[45] Aug. 15, 1978

[54] HALL EFFECT DISPLACEMENT TRANSDUCER USING A BAR MAGNET PARALLEL TO THE PLANE OF THE HALL DEVICE

[75] Inventor: Donald R. Bernier, Lake Orion, Mich.

[73] Assignee: Compunetics, Incorporated, Troy, Mich.

[21] Appl. No.: 746,249

[22] Filed: Dec. 1, 1976

[51] Int. Cl.² ............................................. G01R 33/12
[52] U.S. Cl. ................... 324/208; 338/32 H; 323/94 H; 340/365 L
[58] Field of Search .................. 324/34 D, 34 PS, 45, 324/46; 338/32 R, 32 H; 340/365 L; 323/94 H; 335/1

[56] References Cited

U.S. PATENT DOCUMENTS

| 3,571,774 | 3/1971 | Habrich | 338/32 R |
| 3,668,596 | 6/1972 | Habrich | 338/32 R |
| 3,676,819 | 7/1972 | Keller | 323/94 H |
| 3,848,216 | 11/1974 | Gamble | 338/32 H |
| 3,882,337 | 5/1975 | Pfeffer et al. | 324/45 |

*Primary Examiner*—Robert J. Corcoran
*Attorney, Agent, or Firm*—Harness, Dickey & Pierce

[57] ABSTRACT

A position indicating device for providing a generally linear output in response to displacement; the system includes a Hall effect device and apparatus for providing a response therein in accordance to displacement of a movable stylus or plunger and the method of making the same.

9 Claims, 4 Drawing Figures

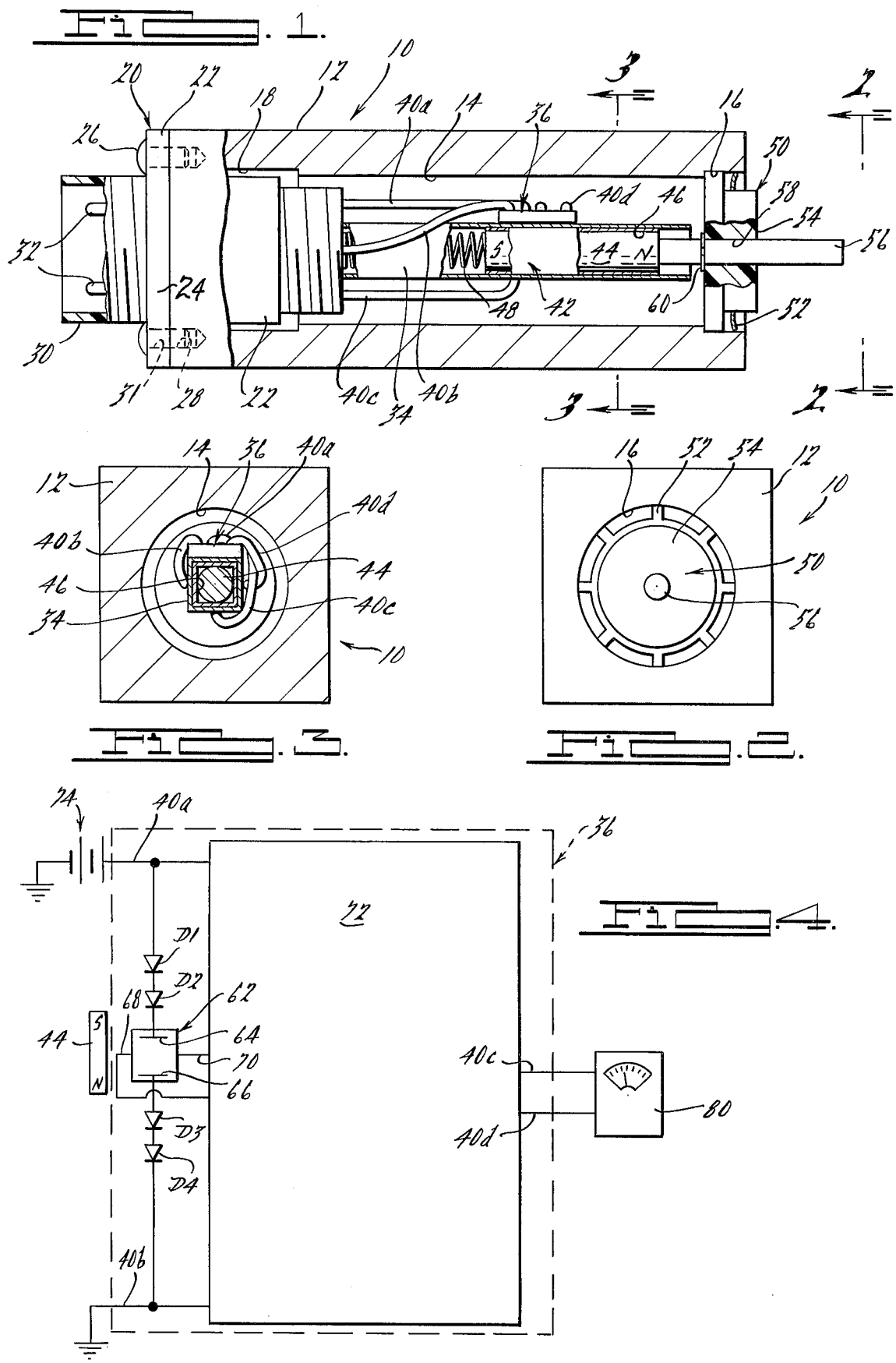

HALL EFFECT DISPLACEMENT TRANSDUCER USING A BAR MAGNET PARALLEL TO THE PLANE OF THE HALL DEVICE

SUMMARY BACKGROUND OF THE INVENTION

The present invention relates to position indicating device for providing an electrical output in response to displacement and more particularly to a position indicating device utilizing a Hall effect device and the method of making same.

In the present invention the position indicating device utilizes a Hall effect device and provides a predictable linear output. To accomplish repeatability in operation the magnet utilized to provide the signal in conjunction with the Hall effect device is movably mounted in a fixed orientation such that it cannot shift or rotate about its axis from its original pre-set position. In this way variations in magnetic characteristics and hence variations in output from one application to another are eliminated.

In the present invention the calibration of the device can be modified by changing the effective length of the magnet while maintaining the coercive force the same. Alternatively the calibration can be varied by varying the coercive force.

Thus it is an object of the present invention to provide a position indicating device utilizing a Hall effect device in which a movable magnet structure is provided having the magnet secured from disorientation about its axis whereby predictable and repeatable results can be obtained.

It is another object to provide a means for varying calibration of the device by varying the effective magnet length and another object for varying calibration by varying coercive force.

It is a general object to provide an improved position indicating device utilizing a Hall effect device.

Other objects, features, and advantages of the present invention will become apparent from the subsequent description and the appended claims, taken in conjunction with the accompanying drawing, in which:

FIG. 1 is a longitudinal sectional view with some parts shown in section and others broken away of a position indicating device embodying features of the present invention;

FIG. 2 is an end view of the position indicating device of FIG. 1; taken along the line 2—2 of FIG. 1;

FIG. 3 is a sectional view of the position indicating device of FIG. 1 taken generally along the lines 3—3 in FIG. 1; and FIG. 4 is an electrical schematic and block diagram depicting the circuitry for the sensing means of the position indicating device of FIG. 1.

Looking now to FIGS. 1-3 a position indicating device assembly 10 includes a tubular housing 12 having a generally rectangular outer shape and having a centrally located annular bore 14. The bore 14 terminates in an enlarged cap receiving counterbore 16 at one end and an enlarged plug receiving counterbore 18 at the opposite end. The housing 12 is made of a soft iron or a non-magnetic material in order to avoid residual magnetism build up.

A standard, male plug or connector 20 has a tubular body portion 22 terminating in an enlarged flange 24. The flange 24 is of a rectangular shape similar to that of the housing 12 and provides a means for mounting to the housing 12 via a plurality of threaded fasteners 26 and associated through openings 31 (in flange 24) and threaded bores 28 (in housing 12). The male connector 20 has an externally threaded connection portion 30 adapted to engage a conventional female connector (not shown) and in addition has a plurality of pins 32 for electrical connection to external circuitry (not shown). The connector 20 is made of a plastic or other suitable material having a low magnetic permeability.

A rectangularly shaped support and guide tube 34 has one end fixed to the inner end of connector portion 22 and extends generally coaxially in bore 14. The tube 34 terminates short of the inner extremity of counterbore 16. Mounted on one of the flats of tube 34 is a magnetic sensing assembly 36 which, as will be seen, includes a Hall effect device and integrated linear amplifier. The electrical connections between the assembly 36 and pins 32 can be appropriately made via electrical conductors 40a-d. The tube 34 is constructed of brass or some other low permeability material and the sensing assembly 36 is incapsulated in plastic and secured to the tube 34 via a suitable adhesive.

A magnet assembly 42 is slidably supported for translational motion within the tube 34. The magnet assembly 42 includes a solid, circularly cross-sectioned permanent, bar magnet 44 which can be magnetically charged as shown on the drawings. The magnet 44 is fixed in a rectangularly shaped magnet support tube 46. Tube 46 has an external shape similar to the internal opening in the guide tube 34 and is slightly smaller so that it can be slidably received therein. The tube 46 has secured at its inner end a coil spring 48. The tube 46 is constructed of brass as well as the spring 48. Thus the magnet 44 can be moved longitudinally in the guide tube 36. Since the support tube 46 is of a non-circular shape similar to that of the guide tube 36, the circumferential orientation of the magnetic field relative to the plane of the sensing assembly 36 will always remain the same, i.e. the magnet 44 cannot rotate about its axis. Since the magnetic field can vary circumferentially about a magnet such as magnet 44, the positive, fixed circumferential location relative to the plane of sensing assembly 36 provided by the interfit between magnet support 46 and guide tube 36 assures that the same field will be continuously presented to the sensing assembly 36. Thus once the output of the position indicating device 10 is calibrated there will be no subsequent deviation or errors due to circumferential field variations which could occur if the magnet 44 could rotate relative to the sensing assembly 36.

A cap 50 is located within the counterbore 16 and has a retaining washer 52 located over a reduced diameter portion 54; the washter 52 engages the side wall of counterbore 16 and retains the cap 50 therein. The cap 50 can be made of plastic or some other low permeability material.

A stylus or movable pin 56 is slidably supported in a bore 58 located in cap 50 generally coaxially with bore 14 of housing 12. The pin 56 is restricted in outer movement via a retaining clip washer 60 located in a groove in pin 56. The pin 56 is made of aluminum or some other low permeability material.

When assembled the inner end of pin 56 will engage the outer end (North pole -N) of magnet 44 and bear thereagainst and will move the magnet 44 to a position towards the sensing assembly 36. This will result in some initial compression of the spring 48.

The position indicating device 10 can be used as a height gauge. The position indicating device 10 would be initially set in a fixture such that at the desired surface height the magnet 42 would be located centrally relative to the Hall effect device in sensing assembly 36 and provide a zero null balance. This would, of course, result in further compression of spring 48 from the assembled condition where magnet 42 is at its extreme outer position in bore 14. Parts that would exceed the standard height would move the pin 56 and magnet 44 in farther to move magnet 44 out of center relative to sensing assembly 36 and out of zero balance to provide a positive output indicating above standard height and the magnitude of the variation. Conversely parts that would be less than the standard height would result in pin 56 and magnet 44 moving outwardly off center and off null balance to provide a negative output indicating below standard height and the magnitude of the variation.

Looking now to FIG. 4 the sensing assembly 36 is shown to include a Hall cell 62 depicted relative to magnet 44. The Hall cell 62 can be of a known type which provides a change in electrical resistance which varies in magnitude in accordance with variations in the difference in magnetic field strength or magnetic flux applied between two plates or electrodes. Thus in FIG. 4 the Hall cell 62 includes a pair of plates or input electrodes 64 and 66 and a pair of output electrodes 68 and 70 connected to a Hall plate 62. The Hall plate 62, as shown in FIGS. 1 and 4, is located proximate to magnet 44 and extends parallely to the magnet axis. Thus when magnet 44 is centrally located relative to plates 64 and 66 the relative resistance will be a given known magnitude. Upon movement of magnet 44 in one direction relative to plates 64 and 66 the resistance will increase and upon movement in an opposite direction the resistance will decrease. Practically speaking it is desirable but not necessary that null or zero balance be obtained at the precise location of magnet 44 centrally relative to plates 64 and 66.

In any event the plates 64, 66 and conductors 68, 70 can be connected to a differential amplifier 72. The amplifier 72 will respond to the variation in impedance as sensed via conductors 68 and 70. A regulated source of direct potential 74 is connected across plates 64 and 66 and also connected to differential amplifier 72. The source of potential 74 has its positive side connected to plate 64 via conductor 40a and a pair of serially connected dropping diodes D1, D2 while plate 66 is connected to ground via conductor 40b and a pair of serially connected dropping diodes D3, D4. The differential amplifier 72 will provide an output signal at output conductors 40c and 40d which will vary in polarity and in magnitude in accordance with the amount of movement of magnet 44 from its null balance position. The signal at conductors 40c, 40d can be appropriately displayed via a display device or meter 80.

The differential amplifier 72 can be of a conventional, known construction and since the details thereof do not constitute a part of the present invention those details have been omitted for purposes of simplicity. In a preferred form of the invention a Hall effect device and linear integrated differential amplifier circuit manufactured and sold by the Sprague Electric Company as Type ULN-3008 was found suitable. Note that the Hall effect device 62 need not be mounted integrally with an amplifier and in that case an externally located amplifier could be used.

The response of the position indicating device 10 can be selectively varied by varying the effective length of magnet 44 while maintaining the same coercive force. Thus a longer magnet 44 will produce a smaller signal per unit of length of movement while a shorter magnet 44 will produce a greater signal per unit of length of movement. Note that in this way the stroke can be varied in the same device while providing the same range of output signals.

In addition the response of the position indicating device 10 can be varied by varying the coercive force of the magnet 44; hence the range of output signals can be varied for a given position indicating device by varying the coercive force and likewise the magnitude of signal per unit of length of movement can be varied.

Thus the position indicating device assembly 10 can be maintained generally intact and variations in response for different applications can be provided simply by replacing the magnet assembly 42. Note that the magnet assembly 42 can be provided with an index mark to be certain of proper field orientation upon disassembly and preassembly.

Note that the source 74 is external of the position indicating device assembly 10 as well as the display device or meter 80. Appropriate connections thereto can be made via pins 32.

While it will be apparent that the preferred embodiments of the invention disclosed are well calculated to fulfill the objects above stated, it will be appreciated that the invention is susceptible to modification, variation and change without departing from the proper scope or fair meaning of the invention.

What is claimed is:

1. A position indicating device comprising: a housing having a central bore, an electrical connector connected to one end of said housing in registry with said bore for providing electrical connection into and out of said housing, a guide and support tube having one end connected to said electrical connector and extending into said central bore at one end, said guide and support tube being generally rectangular in cross section, sensing means responsive to changes in magnitude of magnetic flux for providing an output signal varying in magnitude in accordance with the changes in magnitude of magnetic flux, said sensing means secured to the outer surface of said guide and support tube and magnet means located within said support tube for movement relative to said sensing means whereby the variations in magnitude of said output signal will be provided as a function of the relative position between said magnet means and said sensing means, display means operatively connected with said sensing means and responsive to said output signal for providing a display of the magnitude of the relative position between said magnet means and said sensing means, said magnet means comprising a bar magnet extending longitudinally along an axis and having a circular cross section and a support tube structure fixedly holding said bar magnet, said support tube structure having a generally rectangular cross section and being located within said guide and support tube for relative sliding movement therein, said magnet means including a return, coil spring connected with one end of said bar magnet and engageable with said electrical connector, a cap located in the opposite end of said central bore, a pin slidably supported in said cap and engageable with the opposite end of said bar magnet whereby axial movement of said pin will result in movement of said bar magnet relative to said sensing means, said sensing means comprising a Hall effect device secured to said guide and support tube with its Hall plate parallel to the axis of said bar magnet, said bar magnet having only one north magnetic pole located at one end and only one south magnetic pole located at the opposite end, said output signal indicating a null when said Hall plate is located substantially centrally of said north and south poles.

2. A position indicating device comprising: a housing having a central bore, an electrical connector connected to one end of said housing in registry with said bore for providing electrical connection into and out of said housing, a guide and support tube having one end connected to said electrical connector and extending into said central bore at one end, Hall effect sensing means responsive to changes in magnitude of magnetic flux for providing an output signal varying in magnitude in accordance with the changes in magnitude of magnetic flux, said sensing means secured to said with the plane of said Hall effect device being parallel to the axis of said bore and magnet means connected with said support tube for movement relative to said sensing means whereby the variations in magnitude of said output signal will be provided as a function of the relative position between said magnet means and said sensing means, display means operatively connected with said sensing means and responsive to said output signal for providing a display of the magnitude of the relative position between said magnet means and said sensing means, said magnet means comprising a permanent bar magnet supported for relative, translational movement with said guide and support tube with the axis of the bar magnet being parallel to the axis of said bore, said magnet means including a spring member operable for biasing said permanent magnet, actuating means located in the opposite end of said central bore and operable with said permanent magnet for providing movement of said permanent magnet relative to said sensing means, said bar magnet having only one north magnetic pole located at one end and only one south magnetic pole located at the opposite end, said output signal indicating a null when said sensing means is located substantially centrally of said north and south poles.

3. The device of claim 2 with said magnet means including support surface means for holding said permanent magnet from rotation relative to said guide and support tube.

4. The device of claim 3 with said support surface means comprising non-circular engaging surfaces.

5. A position indicating device comprising: sensing means responsive to changes in magnitude of magnetic flux for providing an output signal varying in magnitude in accordance with the changes in magnitude of magnetic flux, and magnet means supported for movement relative to said sensing means whereby the variations in magnitude of said output signal will be provided as a function of the relative position between said magnet means and said sensing means, display means operatively connected with said sensing means and responsive to said output signal for providing a display of the magnitude of the relative position between said magnet means and said sensing means, said magnet means comprising a longitudinally extending permanent bar magnet having a central axis with only one pair of opposite magnetic poles located at opposite ends and spaced along said central axis, and support means for supporting said magnet means for movement relative to said sensing means along said central axis and holding said permanent magnet and said sensing means from relative rotation about said central axis; said sensing means comprising a Hall effect device having its Hall plate located adjacent to and parallel to said central axis, said output signal indicating a null when said Hall plate is located substantially centrally of said north and south poles.

6. The device of claim 5 with said support means including a guide and support tube, said sensing means secured to said guide and support tube, and said support means comprising an interfitting structure between said magnet and said guide and support tube permitting relative axial movement of said magnet along said support tube while preventing relative rotation.

7. The device of claim 6 with said interfitting structure comprising non-circular mating surfaces between said guide and support tube and said magnet.

8. In a position indicating device including a housing having a central bore, a guide and support tube located at one end of said housing and extending into said central bore, sensing means responsive to changes in magnitude of magnetic flux for providing an output signal varying in magnitude in accordance with the changes in magnitude of magnetic flux, said sensing means including a Hall effect device, and magnet means supported for providing the magnetic flux to said sensing means and including a permanent bar magnet for movement relative to said sensing means whereby the variations in magnitude of said output signal will be provided as a function of the magnitude of relative change in position between said bar magnet and said sensing means, the method comprising: locating the Hall effect device on said guide and support tube at a preselected location with its plane parallel to the axis of the bore, connecting said permanent bar magnet with its axis parallel to the axis of the bore for movement along said guide and support tube and for movement relative to said Hall effect device, and varying the length of said bar magnet to vary the response and/or stroke of the position indicating device, said method further comprising the steps of: locating said bar magnet relative to said Hall effect device with a preselected circumferential field orientation, and securing said bar magnet from rotational movement from said orientation.

9. In a position indicating device including a housing having a central bore, a guide and support tube located at one end of said housing and extending into said central bore, sensing means responsive to changes in magnitude of magnetic flux for providing an output signal varying in magnitude in accordance with the changes in magnitude flux, said sensing means including a Hall effect device and magnet means for providing the magnetic flux to said sensing means and including a longitudinally extending permanent bar magnet having a central axis and supported for movement relative to said sensing means along said central axis whereby the variations in magnitude of said output signal will be provided as a function of the magnitude of relative change in position between said bar magnet and said sensing means, the method comprising: locating the Hall effect device on said guide and support tube at a preselected location with its plane parallel to said axis, connecting said permanent bar magnet for movement along said guide and support tube and for movement along said central axis relative to said Hall effect device, varying the coercive force of said bar magnet to vary the response and/or stroke of the position indicating device, and locating said bar magnet relative to said Hall effect device with a preselected circumferential field orientation, and securing said bar magnet from rotational movement from said orientation.

* * * * *

UNITED STATES PATENT AND TRADEMARK OFFICE
CERTIFICATE OF CORRECTION

PATENT NO. : 4,107,604
DATED : August 15, 1978
INVENTOR(S) : Donald R. Bernier

It is certified that error appears in the above-identified patent and that said Letters Patent are hereby corrected as shown below:

Column 5, line 19, Claim 2, line 11, after "said" second occurrence, insert --guide and support tube--.

Column 6, line 47, claim 9, line 7, after "magnitude" insert --of magnetic--.

Signed and Sealed this

Thirteenth Day of February 1979

[SEAL]

Attest:

RUTH C. MASON
Attesting Officer

DONALD W. BANNER
Commissioner of Patents and Trademarks